United States Patent
Jeong et al.

(10) Patent No.: US 10,177,305 B2
(45) Date of Patent: Jan. 8, 2019

(54) TEMPLATING LAYERS FOR PERPENDICULARLY MAGNETIZED HEUSLER FILMS

(71) Applicant: INTERNATIONAL BUSINESS MACHINES CORPORATION, Armonk, NY (US)

(72) Inventors: Jaewoo Jeong, San Jose, CA (US); Stuart S. P. Parkin, San Jose, CA (US); Mahesh G. Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 15/410,594

(22) Filed: Jan. 19, 2017

(65) Prior Publication Data

US 2018/0205008 A1    Jul. 19, 2018

(51) Int. Cl.

| | |
|---|---|
| *H01L 43/10* | (2006.01) |
| *H01F 10/16* | (2006.01) |
| *H01F 41/14* | (2006.01) |
| *H01L 43/08* | (2006.01) |
| *H01L 43/12* | (2006.01) |
| *C22C 22/00* | (2006.01) |
| *C22C 19/07* | (2006.01) |
| *C22F 1/10* | (2006.01) |
| *C22F 1/16* | (2006.01) |
| *H01F 10/193* | (2006.01) |

(Continued)

(52) U.S. Cl.
CPC .............. *H01L 43/10* (2013.01); *C22C 19/07* (2013.01); *C22C 22/00* (2013.01); *C22F 1/10* (2013.01); *C22F 1/16* (2013.01); *G11C 11/16* (2013.01); *H01F 10/16* (2013.01); *H01F 10/1936* (2013.01); *H01F 10/30* (2013.01); *H01F 41/14* (2013.01); *H01L 43/08* (2013.01); *H01L 43/12* (2013.01); *H01F 10/123* (2013.01); *H01F 10/3254* (2013.01); *H01F 10/3286* (2013.01)

(58) Field of Classification Search
CPC ......... H01L 43/10; H01L 43/08; H01L 43/12; C22F 1/10; C22F 1/16; C22C 19/07; C22C 22/00; H01F 10/16
See application file for complete search history.

(56) References Cited

U.S. PATENT DOCUMENTS

| | | |
|---|---|---|
| 6,834,005 B1 | 12/2004 | Parkin |
| 7,268,984 B2 | 9/2007 | Hasegawa et al. |

(Continued)

*Primary Examiner* — Benjamin P Sandvik
(74) *Attorney, Agent, or Firm* — Daniel E. Johnson

(57) ABSTRACT

Devices are described that include a multi-layered structure that is non-magnetic at room temperature, and which comprises alternating layers of Co and at least one other element E (such as Ga, Ge, and Sn). The composition of this structure is represented by $Co_{1-x}E_x$, with x being in the range from 0.45 to 0.55. The structure is in contact with a first magnetic layer that includes a Heusler compound. An MRAM element may be formed by overlying, in turn, the first magnetic layer with a tunnel barrier, and the tunnel barrier with a second magnetic layer (whose magnetic moment is switchable). Improved performance of the MRAM element may be obtained by placing a pinning layer between the first magnetic layer and the tunnel barrier.

27 Claims, 17 Drawing Sheets

$X_3Z$ Heusler on AE CsCl-type templating layer

(51) Int. Cl.
*H01F 10/30* (2006.01)
*G11C 11/16* (2006.01)
*H01F 10/12* (2006.01)
*H01F 10/32* (2006.01)

(56) References Cited

U.S. PATENT DOCUMENTS

| | | |
|---|---|---|
| 7,558,028 B2 | 7/2009 | Carey et al. |
| 7,672,088 B2 | 3/2010 | Zhang et al. |
| 8,064,244 B2 * | 11/2011 | Zhang ................. G01R 33/098 257/421 |
| 8,526,224 B2 | 9/2013 | Clinton et al. |
| 8,796,797 B2 * | 8/2014 | Doyle ..................... H01L 43/08 257/421 |
| 9,005,997 B2 | 4/2015 | Bang et al. |
| 2011/0149647 A1 | 6/2011 | Kim et al. |
| 2013/0177781 A1 * | 7/2013 | Chepulskyy .......... G11C 11/161 428/811.1 |
| 2016/0380185 A1 * | 12/2016 | Kato ................... H01F 10/3295 257/421 |

* cited by examiner

US 10,177,305 B2

TEMPLATING LAYERS FOR PERPENDICULARLY MAGNETIZED HEUSLER FILMS

TECHNICAL FIELD

The invention is in the field of magnetic random access memory (MRAM), and more particularly, MRAM devices that rely on spin transfer torque.

BACKGROUND

Heusler compounds are a class of materials having the representative formula $X_2YZ$, where X and Y are transition metals or lanthanides, and Z is from a main group element. Due to the chemical distinction between X or Y and Z, they form a unique structure defined by the space group symmetry $L2_1$ (or $D0_{22}$ when they are tetragonally distorted), where four face-centered cubic structures penetrate each other. The properties of Heusler compounds are strongly dependent on the chemical ordering of the elements constituting the compounds. Thus, the fabrication of high quality Heusler films typically requires high temperature thermal processes: for example, deposition at temperatures significantly above room temperature and/or thermal annealing at high temperatures (400° C. or higher).

SUMMARY

Disclosed herein are highly textured, very smooth, high quality ultrathin films of Heusler compounds, which can be fabricated without a thermal annealing process, using a non-magnetic templating layer. The templating layer is preferably formed from a binary alloy of Co—Ga or Co—Ge with the B1 structure, the cubic version of $L1_0$. The templating layer can be deposited at room temperature and is chemically ordered (i.e., the formation of alternating atomic layers of Co and Ga or Ge) at significant annealing temperatures (400° C. and above). We find that ultrathin films of Heusler compounds deposited on these templating layers are highly epitaxial, chemically ordered, high quality films with excellent magnetic properties, including especially high values of perpendicular magnetic anisotropy and square magnetic hysteresis loops (with the remnant moment in zero magnetic field being close to the saturation moment). We attribute this to the similarity between the B1 symmetry of the templating layer and the $L2_1$ or $D0_{22}$ symmetry of the Heusler layer.

The most important characteristic of the underlayer is that it is composed of elements that are similar to those of the Heusler compound. For example, any intermixing or diffusion of the Ga or Ge from the respective CoGa and CoGe underlayers into the Heusler layer does not significantly change the properties of the Heusler layer, since Ga and Ge are from the class of Z elements from which the Heuslers are formed. Similarly, underlayers that include other Z elements, such as Sn, are suitable for the underlayers. The Co within the CoGa and CoGe underlayers can also diffuse into the Heusler without causing significant degradation of the magnetic properties of the Heusler layer, as discussed below. Thus the underlayers can be formed from X'—Z' alloys, where X' is a transition metal and Z' is a main group element.

Another important property of the underlayer is that it can promote chemical ordering of the Heusler compound. The underlayer will inevitably have terraces with atomic steps between neighboring terraces which separates a terrace with a surface formed from Co with a terrace formed from Ga or Ge. Due to the chemical affinity of X (or Y) to Ga or Ge, and of Z to Co, the underlayer promotes the chemical ordering of the Heusler compound at modest temperatures even as low as room temperature, as illustrated in FIG. 1. Annealing does not significantly improve the magnetic properties of the Heusler compound but rather leads to degradation of these properties for anneal temperatures above ~350° C., depending on the Heusler compound.

One embodiment of the invention is a device that includes a multi-layered structure that is non-magnetic at room temperature, with the structure comprising alternating layers of Co and at least one other element E selected from the group consisting of Ga, Ge, and Sn; the composition of the structure can be represented by $Co_{1-x}E_x$, with x being in the range from 0.45 to 0.55 (or more preferably 0.51-0.55 when E is Ga). The device also includes a first magnetic layer that includes a Heusler compound, with the magnetic layer being in contact with the structure. This magnetic layer may advantageously have a thickness of less than 5 nm, or even less than 3 nm, or as little as the thickness of a single unit cell. In some preferred embodiments, the Heusler compound is selected from the group consisting of $Mn_{3.1-z}Ge$, $Mn_{3.1-z}Sn$, and $Mn_{3.1-z}Sb$, with z being in the range from 0 to 1.1. Alternatively, the Heusler compound may be a ternary Heusler, such as $Mn_{3.1-z}Co_{1.1-y}Sn$, wherein $z \leq 1.2$ and $y \leq 1.0$. The device may form part of an MRAM element, in which case a tunnel barrier (such as MgO) is in contact with the magnetic layer, and a second magnetic layer is in contact with the tunnel barrier.

The device may be formed by depositing Co and Ge, thereby forming a composite layer on a substrate (e.g., MgO, or Cr that overlies MgO); annealing the composite layer, so that at least one layer of Co and at least one layer of Ge are formed from the composite layer, thereby forming the multi-layered structure; and then depositing the magnetic layer over the multi-layered structure. If the E includes Ga and/or Ge, the annealing advantageously takes place at a temperature of at least 400° C.; if the element E includes Sn, the annealing advantageously takes place at a temperature less than 400° C. The MgO or MgO/Cr layer preferably has a crystal orientation of (001), as do all the MgO layers described herein.

Another embodiment of the invention is a device that includes a substrate and a multi-layered structure that overlies the substrate. The multi-layered structure is non-magnetic at room temperature and comprises alternating layers of Co and at least one other element E selected from the group consisting of Ga, Ge, and Sn, in which the composition of the structure is represented by $Co_{1-x}E_x$, with x being in the range from 0.45 to 0.55. The device also includes a first magnetic layer in contact with the structure, a tunnel barrier overlying the first magnetic layer, and a second magnetic layer in contact with the tunnel barrier. The first magnetic layer includes a Heusler compound, and the second magnetic layer is in contact with the tunnel barrier and has a magnetic moment that is switchable. Furthermore, a capping layer is in contact with the second magnetic layer. The first magnetic layer includes Mn and an element selected from the group consisting of Sn, Sb, and Ge.

DETAILED DESCRIPTION

New magnetic materials are needed to allow for scaling of STT-MRAM (spin transfer torque-magnetic random access memories) beyond the 20 nm node. These materials must have very large perpendicular magnetic anisotropy (PMA) and, for integration purposes, be compatible with conventional CMOS technologies. Such magnetic materials form electrodes of magnetic tunnel junction (MTJ) based memory elements. An important mechanism for switching the state of the MTJ element is using spin polarized tunneling currents that are passed through the MTJ. The magnitude of this current is limited by the size of the transistors used to provide the write current. This means that the thickness of the electrode must be sufficiently small that it can be switched by the available current. For magnetization values of ~1000 emu/cm³, the electrode must have a thickness that does not exceed approximately 1 nm. The thickness of electrodes formed from Heusler alloys, to date, far exceeds this value in all cases. The thinnest layers to date are for the Heusler compound $Mn_3Ge$, for which layers as thin as 5 nm showed perpendicular magnetic anisotropy and reasonably square magnetic hysteresis loops. The magnetic hysteresis loops for thinner layers showed poor squareness and are much less suitable for STT-MRAM.

CoGa Chemical Templating Layer

Single crystal epitaxial films of $Co_{1-x}Ga_x$ alloy were grown by dc-magnetron sputtering onto respective MgO/Cr or MgO buffer layers overlying MgO(001) single crystal substrates, in an ultra-high vacuum (UHV) chamber with a base pressure of ~2×10⁻⁹ Torr. The MgO/Cr buffer layer was prepared by depositing 20 Å thick MgO and 400 Å thick Cr at room temperature using ion-beam deposition (IBD). The buffer layer was then annealed in situ at 400° C. for 30 minutes in vacuum. We found that the Cr layer is epitaxial, with the (001) orientation out-of-plane, and is also very smooth with a root-mean-squared surface roughness $r_{rms}$~2 Å. Films of 300 Å thick CoGa layers were deposited at room temperature and annealed at various temperatures $T_{AN}$=300, 400, and 500° C. for 30 minutes. The composition of the CoGa layers was determined by Rutherford backscattering measurement.

Figure 1:
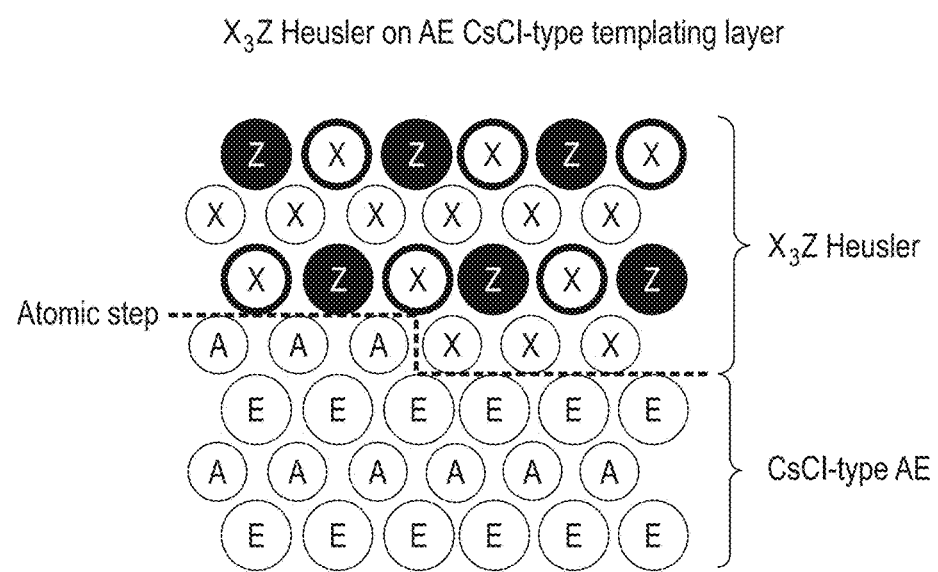
FIG. 1. Illustration of the atomic templating concept. A and X represent transition metal elements, and E and Z represent main group elements.
Figure 2:
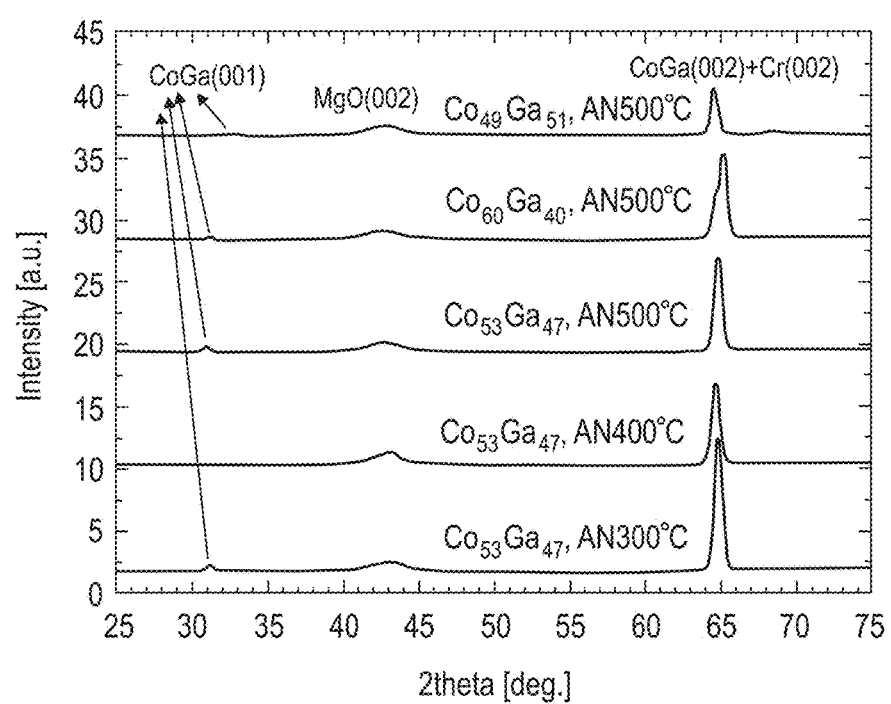
FIG. 2. X-ray diffraction (XRD) scans of 300 Å thick $Co_{100-x}Ga_x$ films on a MgO (001) substrate underlying a seed layer of 20 Å MgO/400 Å Cr. CoGa films were deposited at room temperature and annealed in situ at various temperatures in vacuum.
Figure 3:
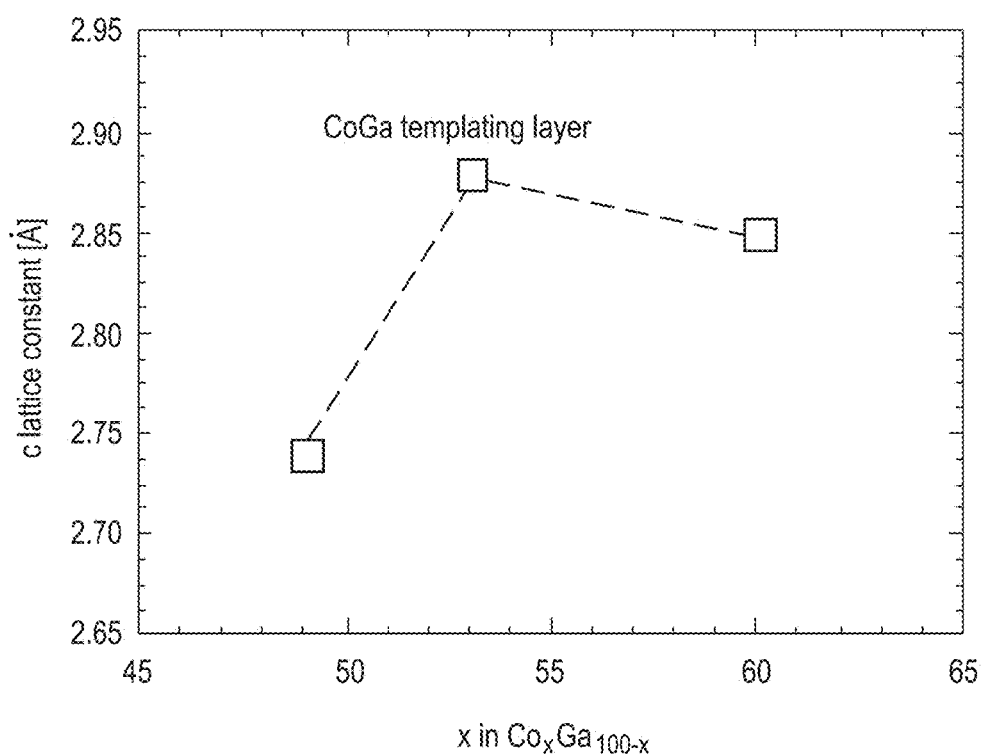
FIG. 3. Lattice constant of the CoGa templating layer as a function of its composition.
Figure 4:
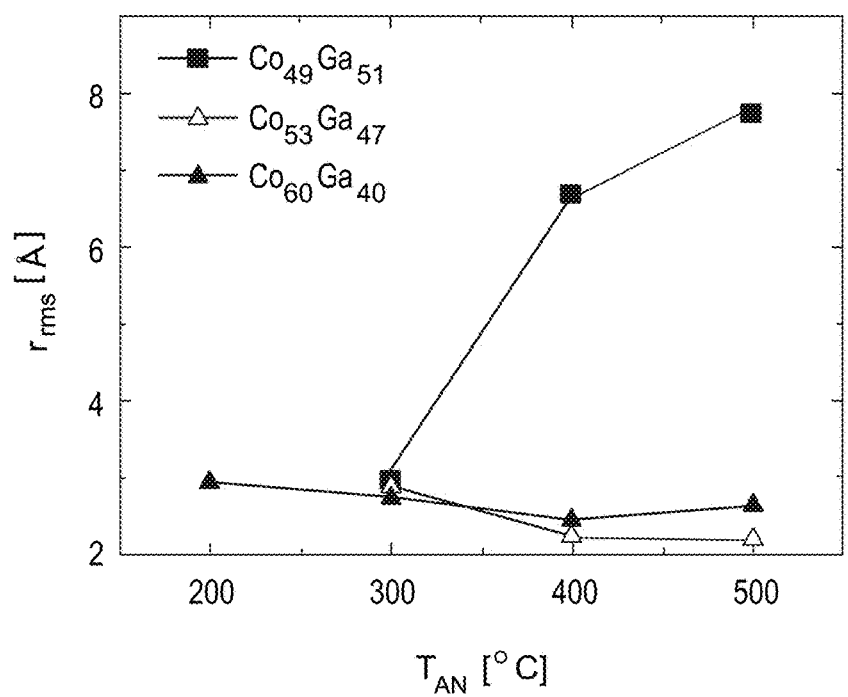
FIG. 4. Root mean square (RMS) roughness ($r_{rms}$) versus annealing temperature of the CoGa templating layer. CoGa films with three distinct compositions (49:51, 53:47, 60:40) are compared.

X-ray diffraction (XRD) θ-2θ scans were performed on these films. FIG. 2 shows sets of XRD scans of $Co_{53}Ga_{47}$ films annealed at various $T_{AN}$ for 30 minutes (300° C., 400° C., 500° C.). The data were compared with those taken from films of $Co_{60}Ga_{40}$ and $Co_{48}Ga_{52}$ annealed $T_{AN}$=500° C. for 30 minutes. The data show the main Cr and CoGa (002) peak at 2θ=~64.8° as well as the CoGa (001) peak at 2θ=~31°. The extracted out-of-plane lattice parameter from XRD data as a function of composition for the CoGa films annealed at $T_{AN}$=500° C. is summarized in FIG. 3. The lattice parameter of $Co_{53}Ga_{47}$ film is ~2.88 Å, close to that of bulk CoGa in B1 structure. Atomic force microscopy was performed to probe the surface morphology of 300 Å thick CoGa templating layers. FIG. 4 shows root-mean-squared surface roughness ($r_{rms}$) for various annealing temperatures. For x≤0.47, $Co_{1-x}Ga_x$ films show a very smooth surface with $r_{rms}$<3 Å while for x=0.51, the surface roughness increases significantly at an annealing temperature somewhere in the range of 300-400° C.

$Mn_3Z$ Tetragonal Heusler

Figure 5:
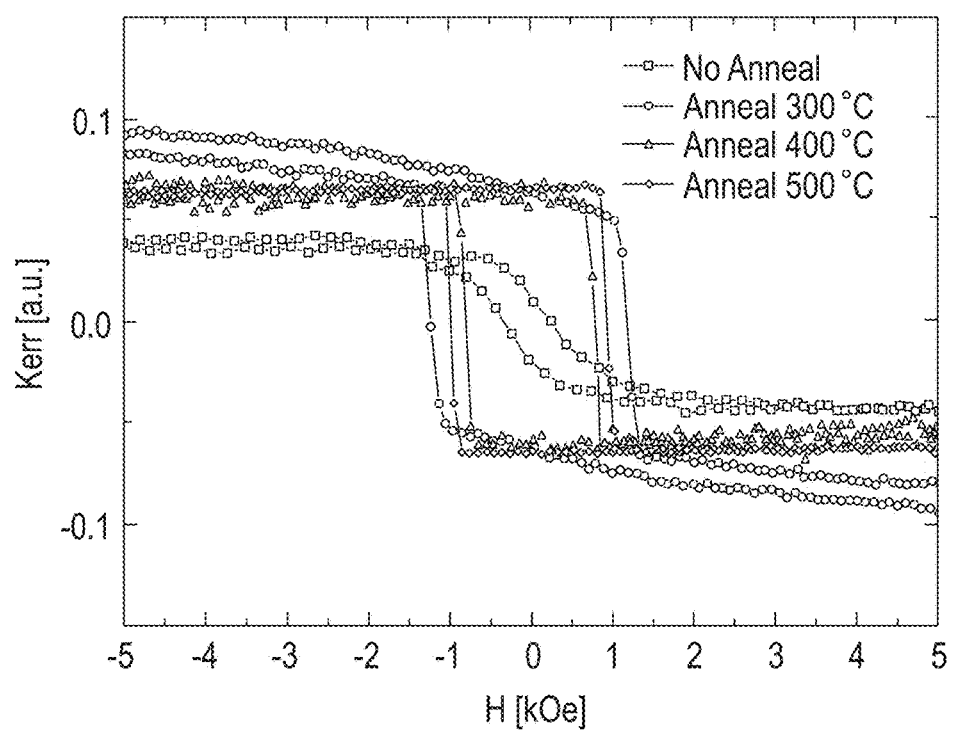
FIG. 5. Perpendicular magneto-optical Kerr effect (P-MOKE) hysteresis loops of 20 Å thick $Mn_3Ge$ films on a CoGa templating layer. CoGa layers were annealed at various temperatures.

20 Å-thick $Mn_3Ge$ films were deposited at room temperature by ion beam deposition on a $Co_{53}Ga_{47}$ templating layer. The stacks were capped by 20 Å thick MgO and 30 Å thick Ta. The resulting structures are of the form MgO(001)/20 Å MgO/300 Å CoGa/20 Å $Mn_3Ge$/20 Å MgO/30 Å Ta. The $Co_{53}Ga_{47}$ layers were deposited at 100° C. and then annealed at various temperatures (300° C., 400° C., 500° C.) for 30 minutes prior to $Mn_3Ge$ deposition. FIG. 5 shows the perpendicular magneto-optical Kerr effect (P-MOKE) hysteresis loops of $Mn_3Ge$ for different annealing temperature of the CoGa templating layer. Interestingly, the magnetic property of $Mn_3Ge$ is strongly affected by templating layer annealing temperature, although the deposition parameters for the $Mn_3Ge$ layers were identical. Excellent PMA is found for the films using CoGa templating layer annealed at 400° C. and 500° C., with a squareness of ~1. Abrupt switching of the magnetic moment implies that there is no second phase.

Figure 6:
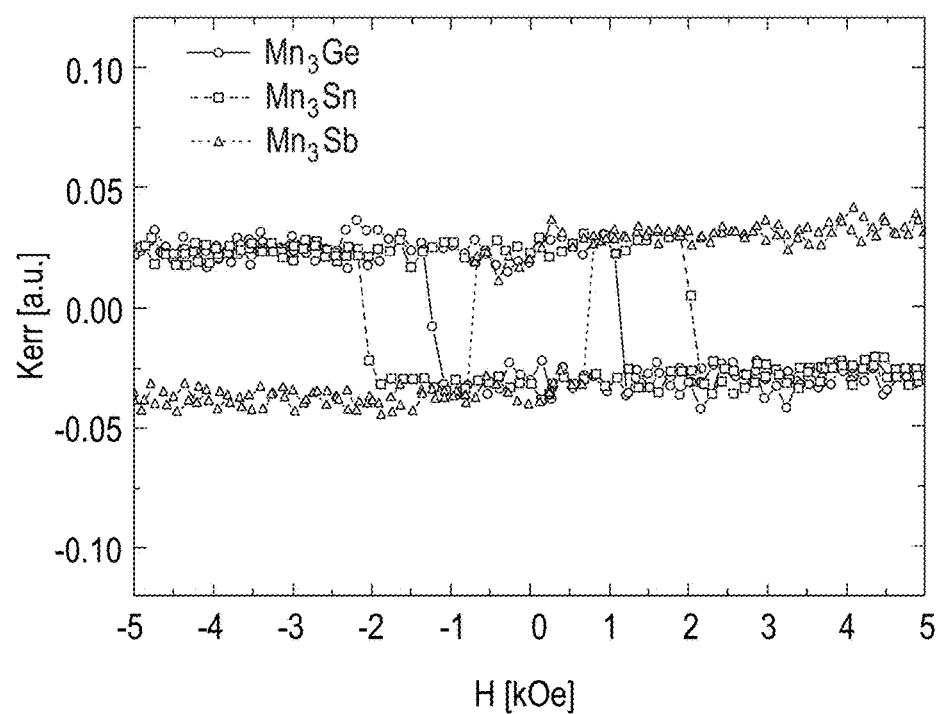
FIG. 6. P-MOKE loop for 20 Å thick $Mn_3Z$ Heusler films (Z=Ge, Sn, and Sb).

The structural ordering of ultrathin layers is likely due to the distinct chemical properties of two elements Co and Ga in the templating layer. Binary (X═Y) and ternary Heusler alloys consist of two or three different types of atoms, respectively. In $X_2YZ$ Heuslers, the Z main group element typically has high chemical affinity for X and Y. In this context, the formation of a chemically ordered structure should take place, irrespective of the choice of Z. FIG. 6 shows the case of $Mn_3Z$ Heusler compounds for Z═Sn, Sb and Ge. 20 Å thick $Mn_3Z$ films were deposited at room temperature on $Co_{53}Ga_{47}$ layers (which had been annealed at 500° C. for 30 minutes). The sample structures are of the form MgO(001)/20 Å MgO/400 Å Cr/300 Å CoGa/20 Å $Mn_3Z$ (Z═Ge, Sn, Sb)/20 Å MgO/30 Å Ta. Excellent PMA was observed in all cases with squareness ~1, but the highest coercivity ~2 kOe is found for the $Mn_3Sn$ film. The polarity of the Kerr signal for $Mn_3Sb$ is opposite that of the $Mn_3Ge$ and $Mn_3Sn$ Heusler alloys.

Figure 7:
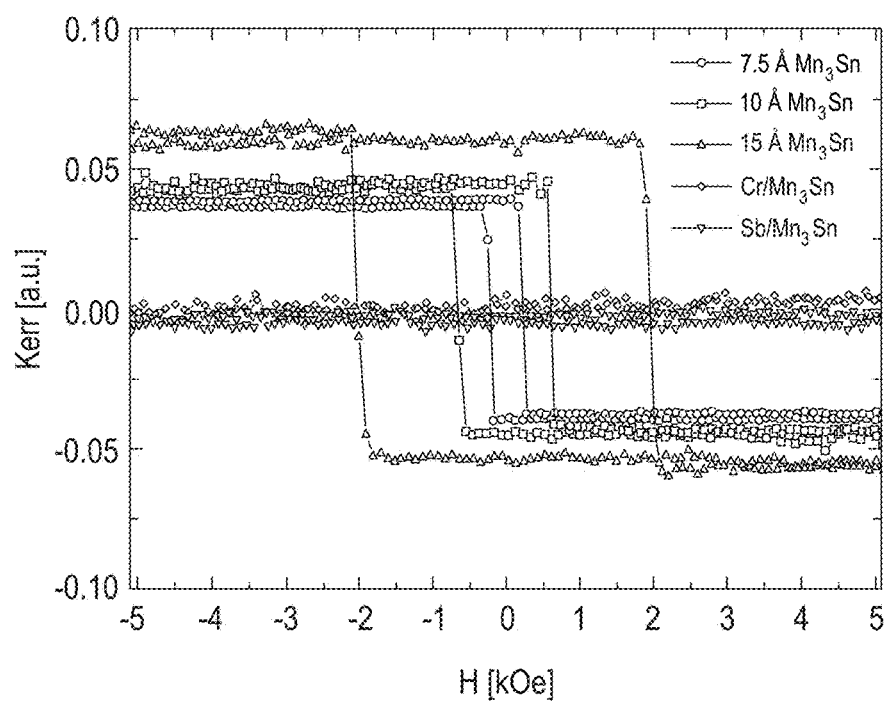
FIG. 7. Thickness dependence of a P-MOKE hysteresis loop for $Mn_3Sn$ Heusler films deposited on a CoGa templating layer.

FIG. 7 details the thickness dependence of the magnetic properties of the $Mn_3Sn$ Heusler alloy on MgO(001)/20 Å MgO/50 Å CoGa (previously annealed at 500° C. for 30 minutes) and capped with 20 Å MgO/30 Å Ta. Also included for comparison are 15 Å $Mn_3Sn$ films on top of MgO(001)/ 20 Å MgO/400 Å Cr and MgO(001)/20 Å MgO/50 Å CoGa/2 Å Sb, referred to as Cr/$Mn_3Sn$ and Sb/$Mn_3Sn$. Clearly, the CoGa underlayer promotes PMA in $Mn_3Sn$ films having a thickness of even one unit cell (7.5 Å). This is the thinnest tetragonal Heusler with PMA to date. Both the coercivity and magnetic moment of the $Mn_3Sn$ film increase as its thickness increases. Lack of PMA for $Mn_3Sn$ films on just Cr films or on CoGa films with a monolayer of Sb (2 Å layer) demonstrates the importance of the CoGa underlayer in promoting PMA in thin Heusler alloys.

Figure 8:
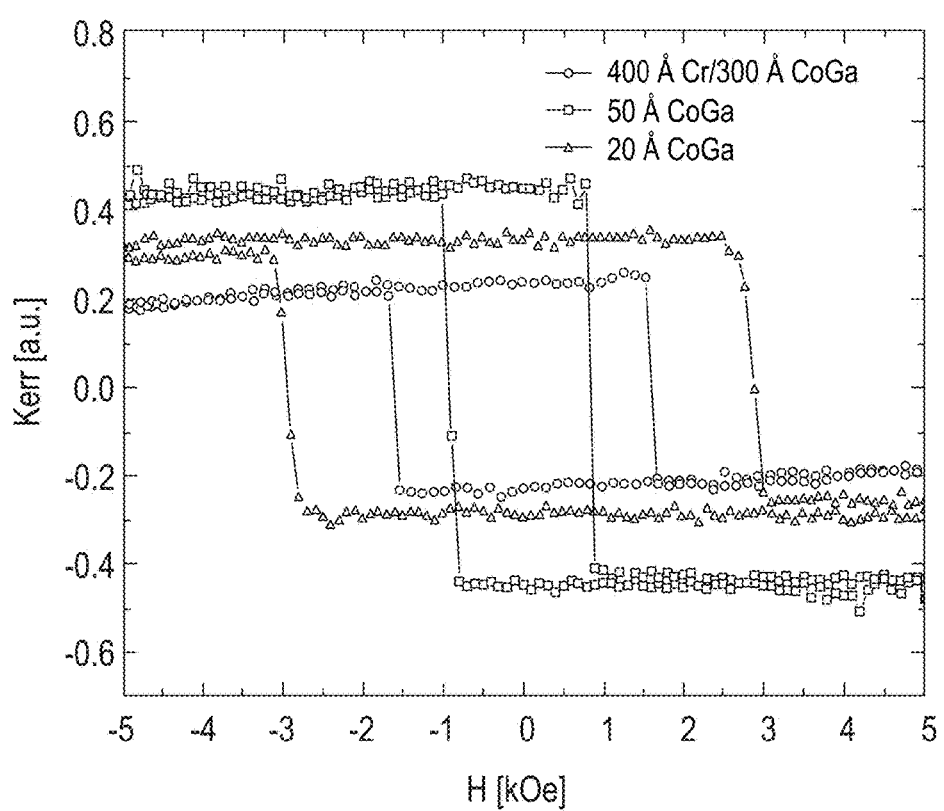
FIG. 8. P-MOKE loop for 10 Å thick $Mn_3Sn$ Heusler films for CoGa templating layer thicknesses of 20 Å, 50 Å, and 300 Å.

FIG. 8 shows the dependence of magnetic properties of the $Mn_3Sn$ Heusler alloy on the thickness of the CoGa underlayer (which had been annealed at 500° C. for 30 minutes). The two thin films of CoGa (50 Å and 20 Å thick) were grown on MgO(001)/20 Å MgO without any Cr. PMA with square loops was observed for these two cases. Also, note that when a Cr layer is used as a seed layer underneath a CoGa layer, a square hysteresis loop is still observed.

Figure 9:
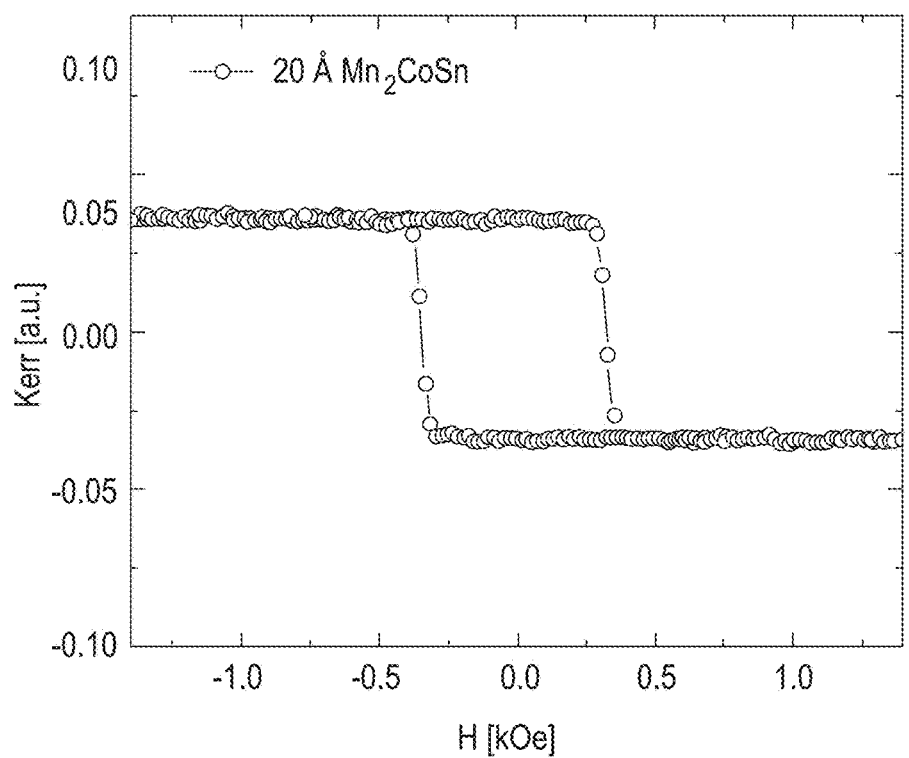
FIG. 9. P-MOKE hysteresis loops of 20 Å thick $Mn_2CoSn$ films on a CoGa templating layer.

FIG. 9 shows the magnetic hysteresis loop for a 20 Å $Mn_2CoSn$ Heusler alloy grown on a CoGa underlayer (which had been annealed at 500° C. for 30 minutes). The film's structure was MgO(001)/20 Å MgO/400 Å Cr/300 Å CoGa/20 Å $Mn_2CoSn$/20 Å MgO/30 Å Ta. The $Mn_2CoSn$ alloy was grown by co-sputtering from three targets of Mn, Co, and Sn, respectively, and the composition of the film was determined by Rutherford backscattering measurements. This $Mn_2CoSn$ film shows excellent PMA with a square hysteresis loop demonstrating the utility of a CoGa underlayer to promote PMA in a thin ternary Heusler alloy.

An MTJ structure formed from MgO(001)/20 Å MgO/400 Å Cr/300 Å $Co_{53}Ga_{47}$/PL1/PL2/15 Å MgO/12 Å $Co_{20}Fe_{60}B_{20}$/50 Å Ta/100 Å Ru was deposited, where PL1 (pinning layer 1) is an ultrathin tetragonal Heusler film and PL2 (pinning layer 2) is an interfacial layer to enhance the spin polarization of this electrode. The MTJ material stack was annealed at 300° C. for 1 hour in a perpendicular field of 1 Tesla (with this set of annealing conditions being referred to herein as high field anneal (HFA)). The area resistance product (RA) and tunneling magnetoresistance (TMR) were characterized by current-in-plane tunneling (CIPT) measurements. A 200-600 Oe perpendicular magnetic field was used to switch the 12 Å $Co_{20}Fe_{60}B_{20}$ layer, which has a lower coercivity than the Heusler electrode. Table 1 summarizes the CIPT results for PL1=$Mn_{1.3}Ga$, $Mn_3Ge$, $Mn_3Sn$, $Mn_3Sb$ and PL2=$Co_{70}Fe_{30}$, $Co_2MnSi$ (CMS). TMR of up to 30% was observed for an MTJ with a magnetic electrode formed from a 30 Å $Mn_3Sn$/12-16 Å CMS layer.

$Mn_3Z$ Heusler Alloy on Amorphous Substrate

The chemical templating of an ultrathin $Mn_3Sn$ Heusler alloy was also demonstrated on an amorphous substrate. We found that a 30 Å MgO seed layer deposited on top of a Si substrate (having 250 Å of $SiO_2$ thereon) was capable of promoting (001) orientation of the CoGa templating layer. A 20 Å $Mn_3Sn$ layer within the sample structure (Si/250 Å $SiO_2$/20 Å MgO/50 Å CoGa/20 Å $Mn_3Sn$/20 Å MgO/30 Å Ta) showed excellent PMA with a coercivity of ~8 kOe.

$Mn_{1.3}Ga$ $L1_0$ Tetragonal Compound

20 Å thick $Mn_{1.3}Ga$ films were also deposited on a CoGa layer (which had been annealed at 500° C. for 30 minutes) at room temperature using dc-magnetron sputtering, and the films were capped by 20 Å thick MgO and 30 Å thick Ta for structure and magnetic property measurements. The final stack was MgO(001)/20 Å MgO/400 Å Cr/300 Å CoGa/20 Å $Mn_{1.3}Ga$/20 Å MgO/30 Å Ta. The Cr layer was deposited at room temperature and annealed at 400° C. for 30 minutes. The $Co_{53}Ga_{47}$ layers were subsequently deposited after cooling the samples to 100° C. and then later annealed at 500° C. for 30 minutes prior to $Mn_{1.3}Ga$ deposition. The compositions of CoGa and MnGa films were determined by Rutherford backscattering (RBS) measurements.

Figure 10:
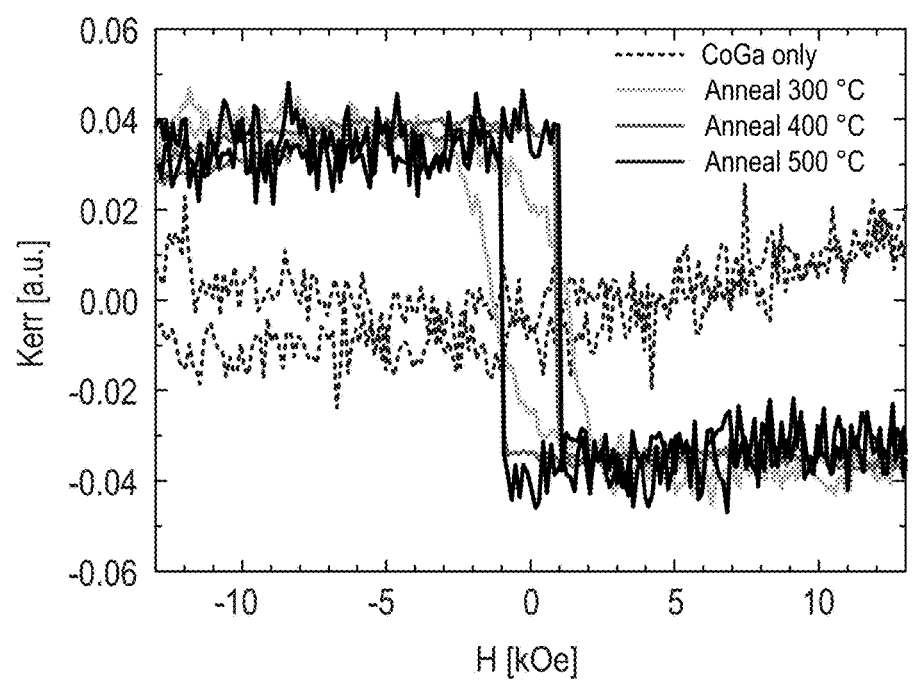
FIG. 10. P-MOKE hysteresis loops of 20 Å thick $Mn_{1.3}Ga$ films on a CoGa templating layer. CoGa layers were annealed at various temperatures.

Magnetic properties of these films were measured by the perpendicular magneto-optical Kerr effect (P-MOKE). FIG. 10 shows P-MOKE hysteresis loops for films with $Co_{53}Ga_{47}$ underlayers that were annealed at various $T_{AN}$. For $T_{AN} \geq 400°$ C., excellent PMA of the 20 Å $Mn_{1.3}Ga$ layer was observed with a squareness of ~1. By comparison with a sample without any $Mn_{1.3}Ga$ layer, it was confirmed that the $Co_{53}Ga_{47}$ templating layer is non-magnetic at room temperature. The existence of excellent PMA strongly suggests that the ultrathin $Mn_{1.3}Ga$ layer, even though deposited at room temperature, forms a well-ordered $L1_0$ phase. We find PMA for a $Mn_{1.3}Ga$ film as thin as 10 Å with no sign of formation of any magnetic dead layer. We also find the PMA of the ultrathin $Mn_{1.3}Ga$ layer is extremely sensitive to the composition of the CoGa templating layer. No sign of PMA or magnetism was observed when the $Co_{53}Ga_{47}$ is replaced by $Co_{48}Ga_{52}$. When $Co_{60}Ga_{40}$ is used, the templating layer becomes magnetic, preventing the $Mn_{1.3}Ga$ layer from having PMA due to the ferromagnetic coupling between the two layers.

CoGe Chemical Templating Layer $Mn_{1.3}Ga$ $L1_0$ Tetragonal Compound

The CoGa templating layer can be replaced with other types of nonmagnetic binary alloys having the B1 structure. Any binary combination of X'Z', where X' is an element from the transition metals (Co, Ni) and Z' is from the main group elements (Al, Ga, Ge, Sn, Sb), can form this type of structure. This was demonstrated by replacing CoGa with a $Co_{47}Ge_{53}$ templating layer. A stack formed from MgO(001)/ 20 Å MgO/400 Å Cr/300 Å $Co_{47}Ge_{53}$/20 Å $Mn_{1.3}Ga$/20 Å MgO/30 Å Ta was prepared. A $Co_{47}Ge_{53}$ layer was deposited at room temperature and annealed at various temperatures (300° C., 400° C., and 500° C.) for 30 minutes.

Figure 11:
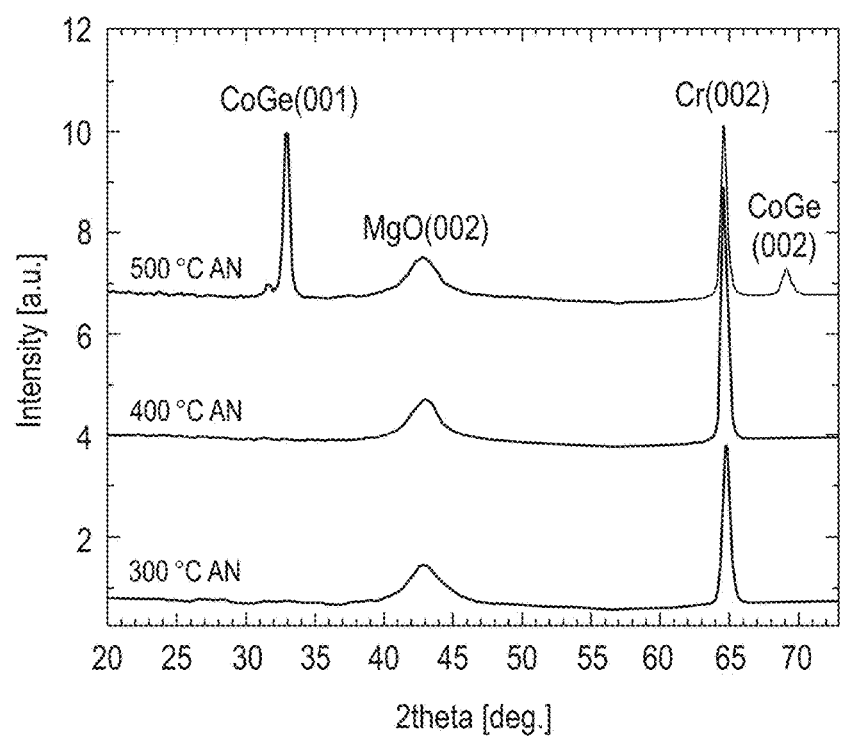
FIG. 11. XRD scans of 300 Å thick $Co_{47}Ge_{53}$ films on a MgO (001) substrate underlying a seed layer of 20 Å MgO/400 Å Cr. A CoGe film was deposited at room temperature and annealed in situ at various temperatures in vacuum.

FIG. 11 shows sets of XRD scans of $Co_{47}Ge_{53}$ films annealed at various $T_{AN}$ for 30 minutes (300° C., 400° C., 500° C.). The data show similar Cr(002) peaks at 2θ=~64.8° independent of the anneal temperature. The CoGe (001) peak at 2θ=~32.9° appears only after annealing at 500° C. indicating that annealing at 500° C. is needed to order CoGe. The lattice parameter of $Co_{47}Ge_{53}$ film is ~2.71 Å, which is significantly less than for CoGa in B1 structure.

Figure 12:
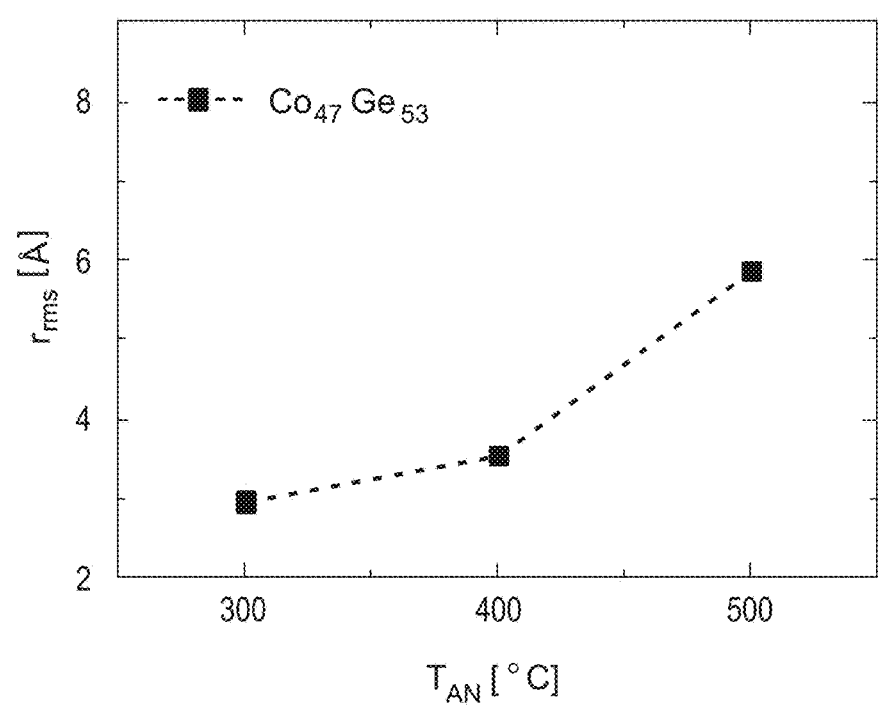
FIG. 12. RMS roughness ($r_{rms}$) versus annealing temperature of a CoGe templating layer.

Atomic force microscopy was performed to probe the surface morphology of a 300 Å thick CoGe templating layer. FIG. 12 shows root-mean-squared surface roughness ($r_{rms}$) for various annealing temperatures. The films annealed at 300° C. have $r_{rms}$~3 Å, but the surface roughness increases at higher anneal temperatures.

Figure 13:
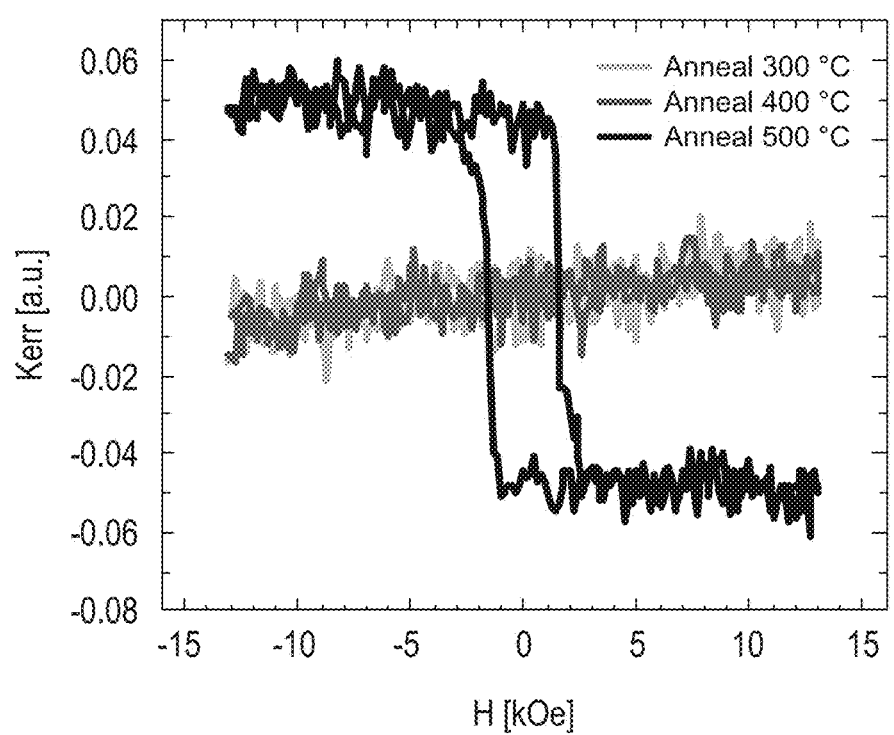
FIG. 13. P-MOKE loops for 20 Å thick $Mn_{1.3}Ga$ films deposited on a CoGe templating layer. CoGe templating layers were annealed in-situ at various temperatures prior to $Mn_{1.3}Ga$ layer deposition.

P-MOKE loops for this series of samples are shown in FIG. 13. Not surprisingly, excellent PMA with squareness ~1 was observed only when the underlying templating layer had been annealed at 500° C. At lower anneal temperatures, where there is no ordering of the CoGe (the underlying templating layer), no PMA was found for the $Mn_{13}Ga$ film.

CoSn Templating Layer
Mn$_3$Sn Tetragonal Heusler

Figure 14:
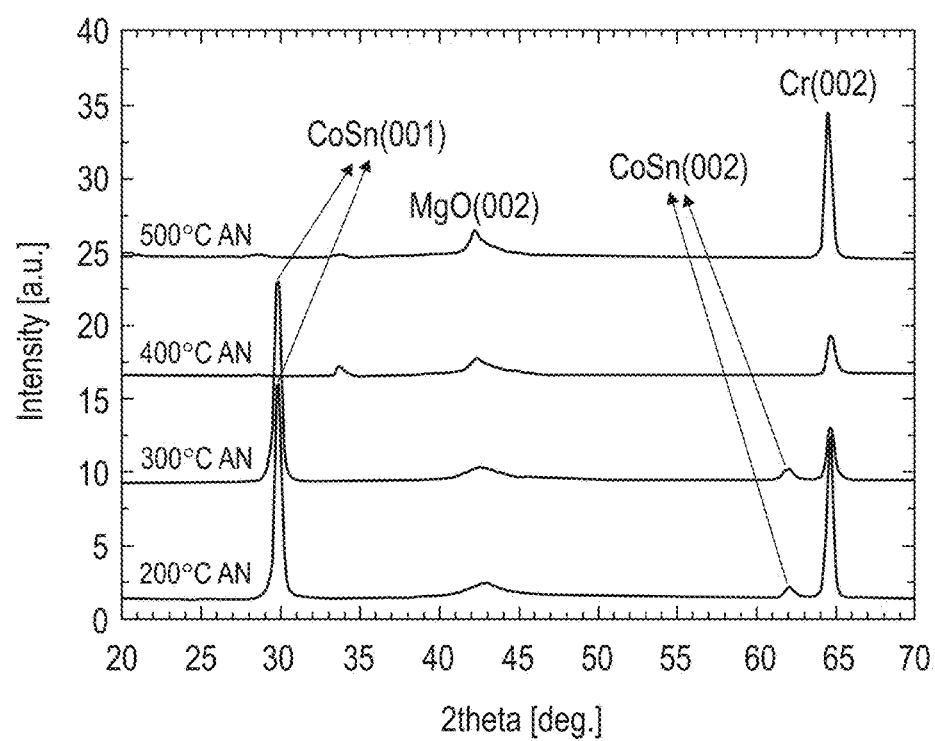
FIG. 14. X-ray diffraction θ-2θ curves of 300 Å thick CoSn films on a MgO (001) substrate underlying a seed layer of 20 Å MgO/400 Å Cr. A CoSn layer was deposited at 100° C. and annealed at various temperatures.

Another nonmagnetic binary alloy having the B1 structure that can be used successfully is CoSn. Included in FIG. 14 are XRD θ-2θ curves of a material stack containing 300 Å thick $Co_{51}Sn_{49}$ films on a MgO/20 Å MgO/400 Å Cr seed layer. A CoSn layer was deposited at 100° C. and subsequently annealed at various temperatures for 30 minutes. These films were capped with 20 Å MgO/20 Å Ta to prevent their oxidation upon exposure to ambient conditions. The CoSn (001) peak at 2θ=~29.5° appears after a thermal anneal at temperatures as low as 200° C. but is no longer observed after anneal at temperatures of 400° C. and higher. This peak is indicative of the formation of alternating layers of Co and Sn.

Figure 15:
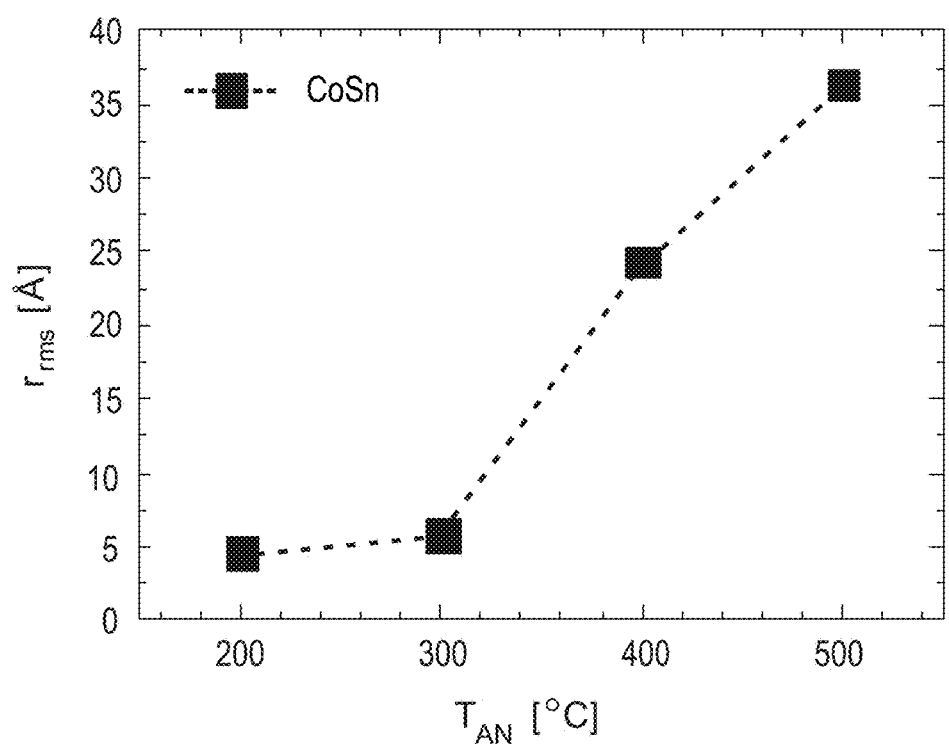
FIG. 15. Annealing temperature dependence of RMS surface roughness $r_{rms}$ of a CoSn templating layer.
Figure 16:
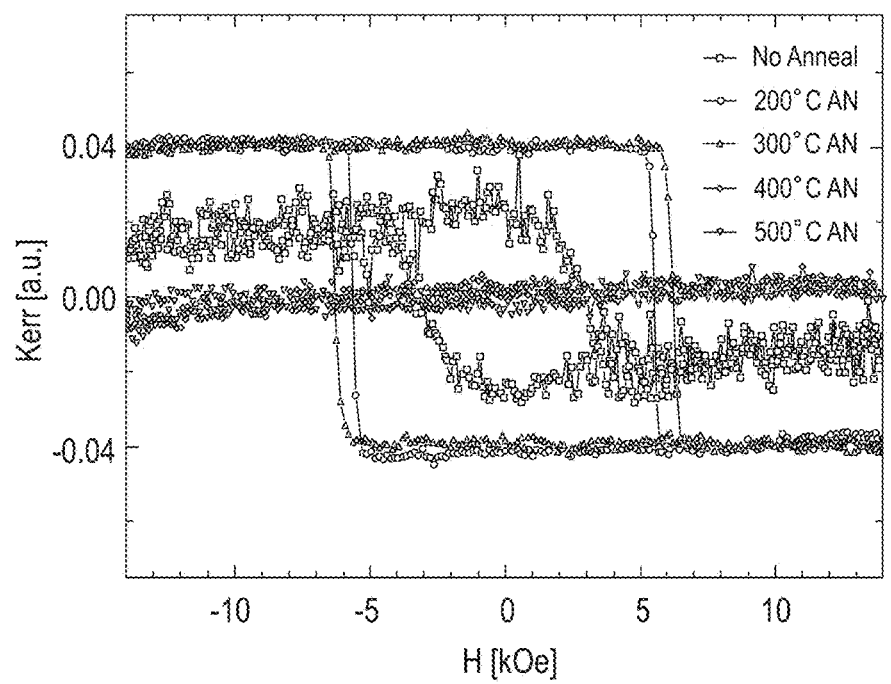
FIG. 16. P-MOKE loop for 20 Å thick $Mn_3Sn$ Heusler films deposited on a MgO(001) substrate underlying a 20 Å MgO seed layer/300 Å CoSn templating layer. The CoSn templating layer was deposited at 100° C. and annealed at 200, 300, 400, and 500° C., respectively, for 30 minutes.

Atomic force microscopy was performed to probe the surface morphology of a 300 Å thick CoSn templating layer. FIG. 15 shows root-mean-squared surface roughness ($r_{rms}$) of the entire material stack with 300 Å thick CoSn annealed at various temperatures. The films annealed at 300° C. or lower have $r_{rms}$<~5 Å. On the other hand, the surface roughness increases substantially at higher anneal temperatures (e.g., at anneal temperatures >300° C.), and the alternate layer ordering is destroyed (see FIGS. 14 and 16). Consequently the 20 Å thick Mn$_3$Sn Heusler films grown on top of such high temperature annealed CoSn show no PMA, as can be clearly seen in FIG. 16 where P-MOKE hysteresis loops are plotted. Moreover, only the 20 Å thick Mn$_3$Sn films on the CoSn templating layer annealed at 200 and 300° C. show square hysteresis loops.

Figure 17:
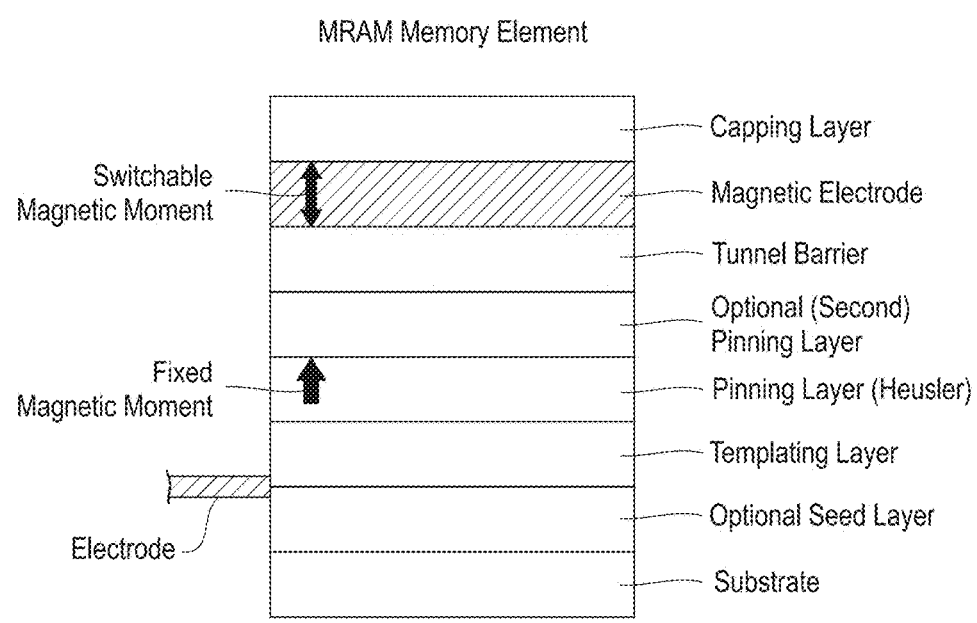
FIG. 17 illustrates a magnetic tunnel junction device that incorporates the templating and Heusler layers described herein.

The structures described herein lend themselves to a variety of applications, including MRAM elements and a racetrack memory device, such as that described in U.S. Pat. No. 6,834,005, issued Dec. 21, 2004 and titled "Shiftable magnetic shift register and method of using the same," which is hereby incorporated herein. One such MRAM element is shown in FIG. 17. As with MRAM elements generally, a tunnel barrier is situated between two magnetic electrodes, one of which has a fixed magnetic moment and the other of which has a magnetic moment that is switchable, thereby permitting the recording and erasing of data. Unlike MRAM elements of the prior art, however, the magnetic layer of FIG. 17 having the fixed magnetic moment (pinning layer) comprises Heusler films such as those described herein. An optional (second) pinning layer may be advantageously employed for even better performance, as described herein, and especially with respect to Table 1 below.

Note that in FIG. 17, the pinning (Heusler, which may be either ferro- or ferri-magnetic) layer overlies a seed layer which in turn overlies a substrate. As described herein, the respective compositions of the seed layer and the substrate may be advantageously chosen to promote growth of the Heusler layer, thereby yielding TMR performance in the range of 10-20%, and even up to 30% or more (see Table 1).

The substrate is preferably MgO (001) and underlies a seed layer, which is preferably a separate MgO (001) layer (deposited after polishing the substrate) and which optionally includes a layer of Cr that overlies the MgO (001) seed layer. Alternatively, in a manufacturing setting, it may be advantageous to employ an amorphous metallic layer or a polycrystalline layer (e.g., Cu) as the substrate. An MgO (001) layer or an MgO (001)/Cr bilayer may then be deposited over this metallic layer, thereby forming a seed layer over the metallic layer.

The templating layer of FIG. 17 is, as described previously herein, a multi-layered structure that is non-magnetic at room temperature, and which comprises alternating layers of Co and at least one other element E (such as Ga, Ge, and Sn). The composition of this structure is represented by $Co_{1-x}E_x$, with x being in the range from 0.45 to 0.55. Overlying the templating layer is a magnetic layer that includes a Heusler compound, e.g., Mn$_3$Ge or Mn$_3$Sn (see Table 1 below). An optional, second pinning layer may be used to increase performance, and may include Fe, a CoFe alloy, or $Co_2MnSi$ (again, see Table 1 below).

The tunnel barrier is preferably MgO (001), although other (001)-oriented tunnel barriers may be used, such as CaO and LiF. The magnetic electrode overlying the tunnel barrier may comprise Fe, a CoFe alloy, or a CoFeB alloy, for example. The capping layer may comprise Mo, W, Ta, Ru, or a combination thereof. Current may be induced by applying a voltage between the two magnetic electrodes, which are separated by the tunnel barrier.

Certain structures described herein may also be used in racetrack memory devices. In this case, the racetrack is a nanowire that may include a substrate, an optional seed layer, a templating layer, and a first magnetic layer of a Heusler compound. (See the discussion above with respect to FIG. 17 for possible compositions of these layers. Note that in a racetrack memory device the tunnel barrier and the switchable magnetic layer shown in FIG. 17 would not normally be present; however, in this case the first magnetic layer shown in FIG. 17 would have a magnetic moment that is switchable rather than fixed.) Magnetic domain walls may be moved along this racetrack, as described in U.S. Pat. No. 6,834,005. Data may be read out of (and stored in) the racetrack by interrogating (or changing) the orientation of the magnetic moment of the magnetic material between adjacent domain walls within the racetrack.

The various layers described herein may be deposited through any one or more of a number of methods, including magnetron sputtering, electrodeposition, ion beam sputtering, atomic layer deposition, chemical vapor deposition, and thermal evaporation.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

TABLE 1

CIPT (current in-plane tunneling) measurement results for various Heusler-based perpendicular MTJs. MCC refers to the seed/templating layer 20 Å MgO/400 Å Cr/300 Å $Co_{53}Ga_{47}$, which is grown on a MgO(001) substrate. CoFeB is the $Co_{20}Fe_{60}B_{20}$ layer. RA (resistance area product) is reported in ohm-μm², and the temperature of the high field anneal is given in the column denoted HFA.

| Seed/templating Layer | PL1 | PL2 | MgO | Free Layer | Capping layer | HFA | RA | TMR |
|---|---|---|---|---|---|---|---|---|
| MCC | 50 Å $Mn_{1.3}Ga$ | | 15 Å | 12 Å CoFeB | 50 Å Ta/ 100 Å Ru | 300° C. | 428 | 1.2% |
| MCC | 50 Å $Mn_3Ge$ | | 15 Å | 12 Å CoFeB | 50 Å Ta/ 100 Å Ru | 300° C. | 985 | 5.1% |
| MCC | 30 Å $Mn_3Ge$ | | 15 Å | 12 Å CoFeB | 50 Å Ta/ 100 Å Ru | 300° C. | 1207 | 4% |
| MCC | 30 Å $Mn_3Sn$ | 4 Å CoFe | 15 Å | 12 Å CoFeB | 50 Å Ta/ 100 Å Ru | 300° C. | 409 | 14% |
| MCC | 30 Å $Mn_3Sn$ | 8 Å CoFe | 15 Å | 12 Å CoFeB | 50 Å Ta/ 100 Å Ru | 300° C. | 245 | 19% |
| MCC | 30 Å $Mn_3Sn$ | 12 Å CoFe | 15 Å | 12 Å CoFeB | 50 Å Ta/ 100 Å Ru | 300° C. | 287 | 0% |
| MCC | 30 Å $Mn_3Sn$ | 4 Å $Co_2MnSi$ | 15 Å | 12 Å CoFeB | 50 Å Ta/ 100 Å Ru | 300° C. | 707 | 14% |
| MCC | 30 Å $Mn_3Sn$ | 8 Å $Co_2MnSi$ | 15 Å | 12 Å CoFeB | 50 Å Ta/ 100 Å Ru | 300° C. | 613 | 18% |
| MCC | 30 Å $Mn_3Sn$ | 12 Å $Co_2MnSi$ | 15 Å | 12 Å CoFeB | 50 Å Ta/ 100 Å Ru | 300° C. | 515 | 30% |
| MCC | 30 Å $Mn_3Sn$ | 16 Å $Co_2MnSi$ | 15 Å | 12 Å CoFeB | 50 Å Ta/ 100 Å Ru | 300° C. | 483 | 31% |

The invention claimed is:

1. A device, comprising:
    a multi-layered structure that is non-magnetic at room temperature, the structure comprising alternating layers of Co and at least one other element E selected from the group consisting of Ga, Ge, and Sn, wherein the composition of the structure is represented by $Co_{1-x}E_x$, with x being in the range from 0.45 to 0.55; and
    a first magnetic layer that includes a Heusler compound, the magnetic layer being in contact with the structure.

2. The device of claim 1, wherein the magnetic moment of the magnetic layer is substantially perpendicular to the interface between the structure and the magnetic layer.

3. The device of claim 2, wherein the magnetic layer has a thickness of less than 5 nm.

4. The device of claim 2, wherein the magnetic layer has a thickness of less than 3 nm.

5. The device of claim 2, wherein the magnetic layer has a thickness of one unit cell.

6. The device of claim 1, wherein the Heusler compound is selected from the group consisting of $Mn_{3.1-z}Ge$, $Mn_{3.1-z}Sn$, and $Mn_{3.1-z}Sb$, with z being in the range from 0 to 1.1.

7. The device of claim 1, wherein the Heusler compound is a ternary Heusler.

8. The device of claim 7, wherein the ternary Heusler is $Mn_{3.1-z}Co_{1.1-y}Sn$, wherein z≤1.2 and y≤1.0.

9. The device of claim 1, wherein E is Ga.

10. The device of claim 1, wherein E is Ge.

11. The device of claim 1, wherein E is Sn.

12. The device of claim 1, comprising a substrate underlying the multi-layered structure.

13. The device of claim 12, comprising a tunnel barrier overlying the first magnetic layer, thereby permitting current to pass through both the tunnel barrier and the first magnetic layer.

14. The device of claim 13, comprising a second magnetic layer in contact with the tunnel barrier.

15. The device of claim 14, wherein the tunnel barrier is MgO.

16. A device, comprising:
    a substrate;
    a multi-layered structure that is non-magnetic at room temperature, the structure comprising alternating layers of Co and at least one other element E selected from the group consisting of Ga, Ge, and Sn, wherein the composition of the structure is represented by $Co_{1-x}E_x$, with x being in the range from 0.45 to 0.55, wherein the structure overlies the substrate;
    a first magnetic layer that includes a Heusler compound, the magnetic layer being in contact with the structure;
    a tunnel barrier overlying the first magnetic layer; and
    a second magnetic layer in contact with the tunnel barrier, wherein the second magnetic layer has a magnetic moment that is switchable.

17. The device of claim 16, comprising a capping layer in contact with the second magnetic layer.

18. The device of claim 16, wherein the first magnetic layer includes Mn and an element selected from the group consisting of Sn, Sb, and Ge.

19. The device of claim 18, wherein the first magnetic layer further includes Co.

20. A method, comprising:
    using the device of claim 14 as a memory element.

21. A method, comprising:
    using the device of claim 12 as part of a racetrack memory device.

22. A method of forming the device of claim 1, comprising:
    depositing Co and Ge, thereby forming a composite layer on a substrate;
    annealing the composite layer, so that at least one layer of Co and at least one layer of Ge are formed from the composite layer, thereby forming the multi-layered structure; and
    depositing the magnetic layer over the multi-layered structure.

23. The method of claim 22, wherein the annealing takes place at a temperature of at least 400° C., and the element E includes Ga.

24. The method of claim 22, wherein the annealing takes place at a temperature of at least 400° C., and the element E includes Ge.

25. The method of claim 22, wherein the annealing takes place at a temperature less than 400° C., and the element E includes Sn.

26. The method of claim 22, wherein the substrate is MgO.

27. The method of claim 26, wherein a layer of Cr overlies the MgO.

* * * * *